(12) United States Patent
Yang

(10) Patent No.: US 12,096,600 B2
(45) Date of Patent: Sep. 17, 2024

(54) HEAT DISSIPATION STRUCTURE AND FOLDABLE DISPLAY DEVICE

(71) Applicant: Wuhan China Star Optoelectronics Semiconductor Display Technology Co., Ltd., Wuhan (CN)

(72) Inventor: Zhenyu Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/621,538

(22) PCT Filed: Nov. 8, 2021

(86) PCT No.: PCT/CN2021/129263
§ 371 (c)(1),
(2) Date: Dec. 21, 2021

(87) PCT Pub. No.: WO2023/077505
PCT Pub. Date: May 11, 2023

(65) Prior Publication Data
US 2024/0032252 A1    Jan. 25, 2024

(30) Foreign Application Priority Data

Nov. 2, 2021    (CN) .......................... 202111288219.2

(51) Int. Cl.
*G06F 1/16*    (2006.01)
*H05K 5/00*    (2006.01)
(Continued)

(52) U.S. Cl.
CPC ....... *H05K 7/20418* (2013.01); *G06F 1/1616* (2013.01); *H05K 7/20963* (2013.01); *G06F 1/203* (2013.01)

(58) Field of Classification Search
CPC ............ H05K 7/20418; H05K 7/20963; G06F 1/1616; G06F 1/1647; G06F 1/203
See application file for complete search history.

(56) References Cited

U.S. PATENT DOCUMENTS 5,206,791 A  *  4/1993  Novotny ............. H01L 23/4332
                                                        257/E23.091
5,828,549 A    10/1998  Gandre
(Continued)

FOREIGN PATENT DOCUMENTS

CN    101211871 A    7/2008
CN    102682671 A    9/2012
(Continued)

*Primary Examiner* — Anthony M Haughton
(74) *Attorney, Agent, or Firm* — PV IP PC; Wei Te Chung

(57) ABSTRACT

A heat dissipation structure and a foldable display device are provided. The heat dissipation structure includes a base material layer including a bottom wall, a first sidewall and a second sidewall. The bottom wall, the first sidewall and the second sidewall form a first accommodation space, the first sidewall and the second sidewall are respectively formed with first connecting holes and second connecting holes; and heat dissipation blades accommodated within the first accommodation space and disposed on the bottom wall. The heat dissipation structure and the foldable display device are capable of balancing the heat of the whole device and have the excellent heat dissipation performance of the whole device.

20 Claims, 5 Drawing Sheets

(51) Int. Cl.
*H05K 7/00* (2006.01)
*H05K 7/20* (2006.01)
*G06F 1/20* (2006.01)

(56) References Cited

U.S. PATENT DOCUMENTS

| | | | |
|---|---|---|---|
| 10,359,241 B2* | 7/2019 | Morrison | H05K 7/2039 |
| 10,551,886 B1 | 2/2020 | de la Fuente | |
| 2001/0010623 A1 | 8/2001 | Ueda | |
| 2006/0012958 A1* | 1/2006 | Tomioka | G06F 1/203 |
| | | | 361/699 |
| 2007/0076381 A1 | 4/2007 | Han | |
| 2009/0071632 A1* | 3/2009 | Bryant | F28D 15/04 |
| | | | 165/104.26 |
| 2016/0299545 A1* | 10/2016 | May | G06F 1/187 |
| 2019/0041922 A1* | 2/2019 | Kurma Raju | H05K 7/2039 |
| 2019/0317574 A1* | 10/2019 | North | G06F 1/203 |
| 2020/0120832 A1* | 4/2020 | Doddi | G06F 1/1681 |
| 2020/0174534 A1* | 6/2020 | Ganta Papa Rao Bala | G06F 1/181 |
| 2020/0309332 A1 | 10/2020 | Yang | |
| 2020/0356143 A1* | 11/2020 | Oh | G06F 1/1616 |
| 2021/0109576 A1* | 4/2021 | Kurma | G06F 1/1681 |
| 2021/0286407 A1* | 9/2021 | Kim | G06F 1/1681 |
| 2021/0321541 A1* | 10/2021 | Paavola | G06F 1/203 |

FOREIGN PATENT DOCUMENTS

| | | |
|---|---|---|
| CN | 104659951 A | 5/2015 |
| CN | 107241878 A | 10/2017 |
| CN | 108419425 A | 8/2018 |
| CN | 108628414 A | 10/2018 |
| CN | 108735113 A | 11/2018 |
| CN | 108806522 A | 11/2018 |
| CN | 208846386 U | 5/2019 |
| CN | 209283600 U | 8/2019 |
| CN | 111050522 A | 4/2020 |
| CN | 111147630 A | 5/2020 |
| CN | 211820364 U | 10/2020 |
| CN | 212183662 U | 12/2020 |
| CN | 212519072 U | 2/2021 |
| CN | 213368439 U | 6/2021 |
| CN | 113454564 A | 9/2021 |
| CN | 113487969 A | 10/2021 |
| JP | H11101050 A | 4/1999 |
| JP | 2000133977 A | 5/2000 |
| TW | M284186 U | 12/2005 |
| TW | I649024 B | 1/2019 |

\* cited by examiner

HEAT DISSIPATION STRUCTURE AND FOLDABLE DISPLAY DEVICE

CROSS-REFERENCE TO RELATED APPLICATION

This application is a national phase application under 35 U.S.C. § 371 of PCT Application No. PCT/CN2021/129263 filed Nov. 8, 2021, which claims priority to Chinese Application No. 202111288219.2 filed Nov. 2, 2021, the contents of which are incorporated herein by reference in their entirety.

FIELD OF INVENTION

This disclosure relates to a technical field of heat dissipation, and more particularly to a heat dissipation structure and a foldable display device.

BACKGROUND OF INVENTION 5G has brought users better Internet access experiences, but the high heat generated is not to be underestimated. Heat dissipation has become the problem that highly needs to be solved. This is particularly true for foldable display devices. Important parts, such as an electronic component, a hinge shaft and the like, in the foldable display device always generate non-negligible heat in an operating process, and local overheating causes poor functionalities, such as screen burn-in, non-uniform screen brightness, shortened service lifetime and the like, and further reduces the user hand's feeling. So, increasing the heat dissipation performance of the 5G foldable display device is very important to its popularization.

The main heat dissipation solution of the known foldable display device at the current stage is to attach a heat dissipation material (e.g. graphite material) for thermal radiation and heat dissipation. Actually, the regions of the existing foldable display device to which the graphite material can be attached are fewer, so that the heat dissipation efficiency through the thermal radiation is not high. In addition, the upper and lower middle frames of the foldable display device are separated from each other by the shaft, so the inner space connectivity is poor, and the non-uniform heat distribution tends to occur.

SUMMARY OF INVENTION

Technical Problems

Therefore, this disclosure provides a heat dissipation structure capable of balancing the heat of the whole device and having the excellent heat dissipation performance of the whole device, and a foldable display device.

Technical Solutions

Therefore, this disclosure provides a heat sink having the better heat dissipation performance and hydrophobic performance, a preparation method thereof, and an electronic device.

In one aspect, this disclosure provides a heat dissipation structure including: a base material layer including a bottom wall, and a first sidewall and a second sidewall respectively disposed opposite two sides of the bottom wall, wherein the bottom wall, the first sidewall and the second sidewall form a first accommodation space, multiple first connecting holes penetrating through the first sidewall are formed on the first sidewall, and multiple second connecting holes penetrating through the second sidewall are formed on the second sidewall; and multiple heat dissipation blades accommodated within the first accommodation space and disposed on the bottom wall.

In an alternative embodiment of this disclosure, a material of the base material layer is a metal material.

In an alternative embodiment of this disclosure, the heat dissipation structure further includes a first graphene layer and a second graphene layer, wherein the first graphene layer is formed on the first sidewall, the second graphene layer is formed on the second sidewall, the first graphene layer and the second graphene layer are disposed in the first accommodation space, the first connecting holes further penetrate through the first graphene layer, and the second connecting holes further penetrate through the second graphene layer.

In an alternative embodiment of this disclosure, the first connecting holes are separately disposed on one end of the first sidewall away from the bottom wall, the second connecting holes are separately disposed on one end of the second sidewall away from the bottom wall, and positions of the first connecting holes correspond to positions of the second connecting holes in a one-to-one manner.

In an alternative embodiment of this disclosure, the heat dissipation blades are separately disposed on the bottom wall in a lengthwise direction of the bottom wall, and intersecting lines between the heat dissipation blades and the bottom wall are inclined to a widthwise direction of the bottom wall.

In an alternative embodiment of this disclosure, the heat dissipation structure further includes one or multiple fixing blocks, wherein the fixing blocks are separately disposed on the bottom wall in a lengthwise direction of the bottom wall, and each of the fixing blocks has a fixing hole for fixing a shaft of a hinge.

This disclosure further provides a foldable display device including a flexible screen, a first middle frame, a second middle frame, a hinge and a heat dissipation structure, wherein: two ends of the hinge are respectively mounted on the first middle frame and the second middle frame and can drive the first middle frame and the second middle frame to be folded or deployed relatively to a shaft of the hinge; the flexible screen is disposed above the hinge, and two ends of the flexible screen are respectively mounted on the first middle frame and the second middle frame; the heat dissipation structure is disposed between the first middle frame and the second middle frame and mounted on the shaft of the hinge; and the heat dissipation structure includes:

a base material layer including a bottom wall, and a first sidewall and a second sidewall respectively disposed opposite two sides of the bottom wall, wherein the bottom wall, the first sidewall and the second sidewall form a first accommodation space, the shaft of the hinge is mounted on the bottom wall, multiple first connecting holes penetrating through the first sidewall are formed on the first sidewall, and multiple second connecting holes penetrating through the second sidewall are formed the second sidewall, wherein:

the flexible screen and the first middle frame form a second accommodation space, and the flexible screen and the second middle frame form a third accommodation space; and the first connecting holes are connected to the second accommodation space, and the second connecting holes are connected to the third accommodation space.

In an alternative embodiment of this disclosure, the heat dissipation structure further includes multiple heat dissipation blades accommodated within the first accommodation space and disposed on the bottom wall.

In an alternative embodiment of this disclosure, the heat dissipation blades are separately disposed on the bottom wall in a lengthwise direction of the bottom wall, and intersecting lines between the heat dissipation blades and the bottom wall are inclined to a widthwise direction of the bottom wall.

In an alternative embodiment of this disclosure, a material of the base material layer is a metal material.

In an alternative embodiment of this disclosure, the heat dissipation structure further includes a first graphene layer and a second graphene layer, wherein the first graphene layer is formed on the first sidewall, the second graphene layer is formed on the second sidewall, the first graphene layer and the second graphene layer are disposed in the first accommodation space, the first connecting holes further penetrate through the first graphene layer, and the second connecting holes further penetrate through the second graphene layer.

Useful Effects

In this disclosure, a heat dissipation structure is added to the position of the shaft of the hinge of the existing foldable display device, and the connecting holes are provided on the sidewall of the base material of the heat dissipation structure, wherein the connecting holes can connect the first accommodation space, formed by the bottom wall and the sidewall of the base material layer of the heat dissipation structure, to the second accommodation space and the third accommodation space between the flexible screen and the middle frames (the first middle frame and the second middle frame), so that the connections between the inner spaces of the whole foldable display device can be implemented. As a result, the heat of the whole foldable display device can be balanced to make the heat of the whole device be uniformly distributed. Second, the heat dissipation structure has the heat dissipation blades, so the heat dissipation blades push the air in an axial direction of the shaft of the hinge to form the local negative pressure when the foldable display device is folded or deployed. At this time, the air in the second accommodation space and the air in the third accommodation space are pushed, by the atmosphere, into the first accommodation space of the heat dissipation structure through the connecting holes to form flowing air streams, and take the heat away from the second accommodation space and the third accommodation space, thereby increasing the circulation rate of the air in the whole device, and achieving the good heat dissipation effect of the whole device. Third, the metal (e.g. copper) is adopted to manufacture the base material layer of the heat dissipation structure, and the graphene layers (the first graphene layer and the second graphene layer) are formed on the surface of the base material layer facing the hinge. Because the copper has the good thermal conductivity and the high Z-direction thermo-conductive efficiency, the heat in the second accommodation space and the third accommodation space can be rapidly transferred to the graphene layers through the base material layer, thereby increasing the heat conductivity rate and heat dissipation rate. In addition, disposing the graphene layers on the base material layer of the heat dissipation structure enlarges the thermal radiation surface areas of the graphene layers, thereby increasing the overall thermal radiation and heat dissipation efficiency. Fourth, the two heat dissipation methods are combined, so that the good heat dissipation effect of the whole device can be obtained, thereby decreasing the poor effects of the screen burn-in, non-uniform brightness and the like, protecting the electronic components inside the foldable display device, increasing the lifetime of the foldable display device and improving the user experience.

DESCRIPTION OF DRAWINGS

In order to explain the technical solution in this disclosure more clearly, the drawings required for the description of the embodiments will be briefly introduced. Obviously, the drawings in the following description only relate to some embodiments of this disclosure. For those skilled in the art, other drawings can be obtained from these drawings without creative works.

DETAILED DESCRIPTION OF EMBODIMENTS

Figure 1:
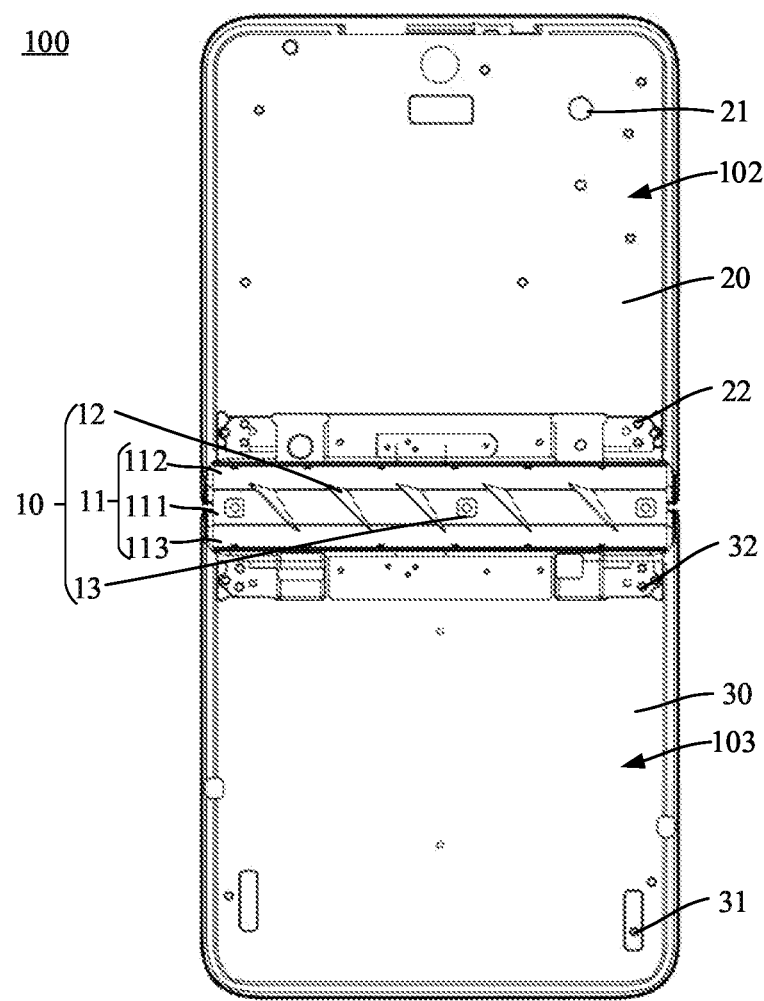
FIG. 1 is a pictorial view showing a foldable display device, including a first middle frame, a second middle frame and a heat dissipation structure, provided by a preferred embodiment of this disclosure.

The technical solutions in the embodiments of this disclosure will be clearly and completely described in the following with reference to the drawings of the embodiments of this disclosure. Obviously, the described embodiments are only a part of the embodiments of this disclosure, rather than all the embodiments. Based on the embodiments of this disclosure, all other embodiments obtained by those skilled in the art without creative works are deemed as falling within the scope of this disclosure.

In the description of this disclosure, it is to be understood that the terms "upper," "lower" and the like indicating the orientation or position relationships are the orientation or position relationships based on the drawing, are only provided for the purposes of describing this disclosure and simplifying the description, but do not indicate or imply that the directed devices or elements must have the specific orientations constructed and operated in the specific orientations, and thus cannot be understood as the restriction to this disclosure. In addition, the terms "first" and "second" are only used for descriptive purposes, and cannot be understood as indicating or implying relative importance or implicitly indicating the number of technical features as indicated. Thus, the features defined with "first" and "second" may explicitly or implicitly include one or multiple features. In the description of this disclosure, the meaning of "multiple" includes two or more than two, unless otherwise specified.

In this disclosure, reference numbers and/or reference letters may be repeated in different implementations, wherein such the repetition is for the purpose of simplification and clarity, and does not in itself indicate the relationship between the various embodiments and/or configurations discussed.

This disclosure aims at the technical problems that the existing foldable display device has the fewer regions to which graphite can be attached, that the heat dissipation efficiency through thermal radiation is not high, that the upper and lower middle frames of the foldable display device are separated from each other by the shaft, that the inner space connectivity is poor, and that the non-uniform heat distribution tends to occur. In this disclosure, a heat dissipation structure is added to a position of a shaft of a hinge of the existing foldable display device, and connecting holes are provided on a sidewall of a base material of the heat dissipation structure, wherein the connecting holes can connect a first accommodation space, formed by a bottom wall and the sidewall of the base material layer of the heat dissipation structure, to a second accommodation space and a third accommodation space between a flexible screen and middle frames (a first middle frame and a second middle frame), so that connections between inner spaces of the whole foldable display device can be implemented. As a result, the heat of the whole foldable display device can be balanced to make the heat of the whole device be uniformly distributed. Second, the heat dissipation structure has heat dissipation blades, so the heat dissipation blades push the air in an axial direction of the shaft of the hinge to form a local negative pressure when the foldable display device is folded or deployed. At this time, the air in the second accommodation space and the air in the third accommodation space are pushed, by the atmosphere, into the first accommodation space of the heat dissipation structure through the connecting holes to form flowing air streams, and take the heat away from the second accommodation space and the third accommodation space, thereby increasing a circulation rate of the air in the whole device, and achieving a good heat dissipation effect of the whole device. Third, a metal (e.g. copper) material is adopted to manufacture the base material layer of the heat dissipation structure, and the graphene layers (the first graphene layer and the second graphene layer) are formed on a surface of the base material layer facing the hinge. Because the copper has the good thermal conductivity and the high Z-direction thermoconductive efficiency, the heat in the second accommodation space and the third accommodation space can be rapidly transferred to the graphene layers through the base material layer, thereby increasing the heat conductivity rate and heat dissipation rate. In addition, disposing the graphene layers on the base material layer of the heat dissipation structure enlarges thermal radiation surface areas of the graphene layers, thereby increasing the overall thermal radiation and heat dissipation efficiency.

Referring to FIGS. 1 to 5, a preferred embodiment of this disclosure provides a foldable display device 100 including a flexible screen (not shown), a first middle frame 20, a second middle frame 30, a hinge (not shown), an electronic component (not shown) and a heat dissipation structure 10. Two ends of the hinge are respectively mounted on the first middle frame 20 and the second middle frame 30 and can drive the first middle frame 20 and the second middle frame 30 to be folded or deployed relatively to a shaft of the hinge. The flexible screen is disposed above the hinge, and two ends of the flexible screen are respectively mounted on the first middle frame 20 and the second middle frame 30. The heat dissipation structure 10 is disposed between the first middle frame 20 and the second middle frame 30 and mounted on the shaft of the hinge. The heat dissipation structure 10 may function as a shaft cover of the hinge. The flexible screen and the first middle frame 20 form a second accommodation space 102, and the flexible screen and the second middle frame 30 form a third accommodation space 103.

Figure 2:
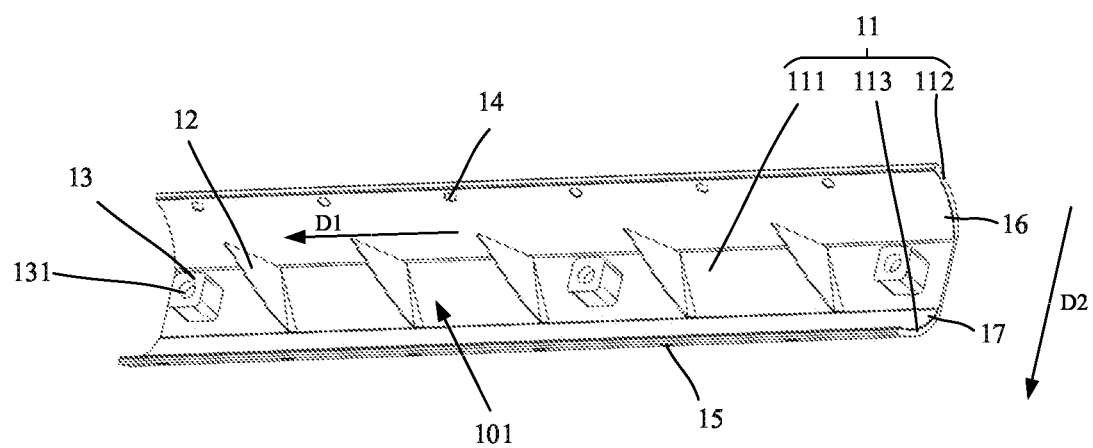
FIG. 2 is an enlarged pictorial view showing the heat dissipation structure of FIG. 1.
Figure 3:
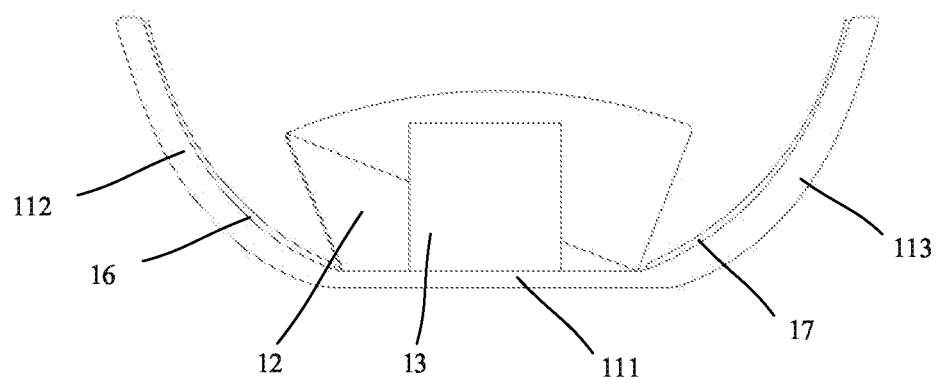
FIG. 3 is an axial view showing the heat dissipation structure of FIG. 2.
Figure 4:
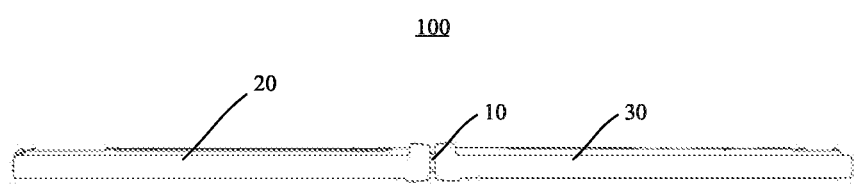
FIG. 4 is a side view showing the foldable display device of FIG. 1 in a deployed state.
Figure 5:
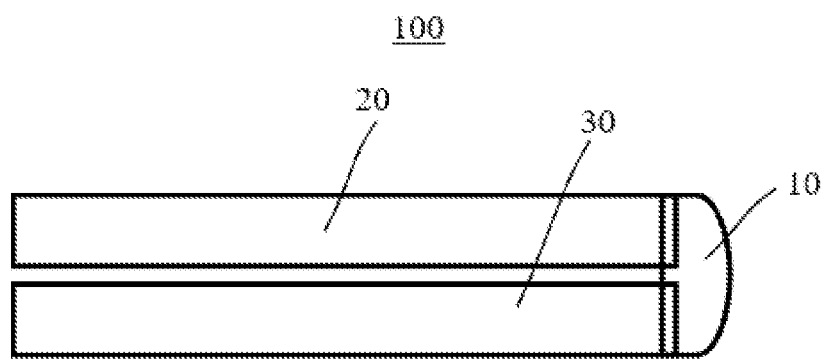
FIG. 5 is a schematic view showing the foldable display device of FIG. 1 in a folded state.

Specifically, referring to FIGS. 1 and 2, the heat dissipation structure 10 includes a base material layer 11 and heat dissipation blades 12.

The material of the base material layer 11 is a metal material, such as silver, copper and the like, having the high coefficient of heat conductivity. Preferably, the material of the base material layer 11 is copper.

The base material layer 11 includes a bottom wall 111, and a first sidewall 112 and a second sidewall 113 respectively disposed opposite two sides of the bottom wall 111. The bottom wall 111, the first sidewall 112 and the second sidewall 113 form a first accommodation space 101. Multiple first connecting holes 14 penetrating through the first sidewall 112 are formed on the first sidewall 112, and multiple second connecting holes 15 penetrating through the second sidewall 113 are formed on the second sidewall 113.

In an alternative embodiment of this disclosure, the first connecting holes 14 are separately disposed on one end of the first sidewall 112 away from the bottom wall 111, the second connecting holes 15 are separately disposed on one end of the second sidewall 113 away from the bottom wall 111, and positions of the first connecting holes 14 correspond to positions of the second connecting holes 15 in a one-to-one manner. Preferably, the first connecting holes 14 are equidistantly and separately disposed on the first sidewall 112, and the second connecting holes 15 are equidistantly and separately disposed on the second sidewall 113.

In this embodiment, the bottom wall 111, the first sidewall 112 and the second sidewall 113 are integrally formed together. In other embodiments, the bottom wall 111, the first sidewall 112 and the second sidewall 113 may be connected together through a binder or mechanical structures.

The first sidewall 112 and the second sidewall 113 are respectively arced, and centers of arcs of the first sidewall 112 and the second sidewall 113 are disposed in the first accommodation space 101.

A lengthwise direction of the bottom wall 111 is defined as D1, wherein the lengthwise direction of the bottom wall 111 is the same as the axial direction of the shaft of the hinge. The first connecting holes 14 are disposed on the first sidewall 112 in the lengthwise direction D1 of the bottom wall 111, and the second connecting holes 15 are disposed on the second sidewall 113 in the lengthwise direction D1 of the bottom wall 111.

The heat dissipation structure 10 further includes one or multiple fixing blocks 13. The fixing blocks 13 are equidistantly or not equidistantly disposed on the bottom wall 111 in the lengthwise direction D1 of the bottom wall 111.

Each of the fixing blocks 13 has a fixing hole 131 for fixing the shaft of the hinge. Specifically, the fixing hole 131 fixes the shaft of the hinge in conjunction with a pin or screw matching therewith.

The heat dissipation structure 10 further includes the heat dissipation blades 12, which are accommodated within the first accommodation space 101 and equidistantly or not equidistantly disposed on the bottom wall 111. Preferably, the heat dissipation blades 12 are equidistantly disposed on the bottom wall 111.

In this embodiment, each of intersecting lines between the heat dissipation blades 12 and the bottom wall 111 is inclined to a widthwise direction D2 of the bottom wall 111 perpendicular to the lengthwise direction D1. The heat dissipation blades 12 disposed and inclined in the same direction are further beneficial to the air stream flowing, and are thus further beneficial to the heat dissipation.

Because the fixing blocks 13 and the heat dissipation blades 12 are disposed on the bottom wall 111, at least one of the heat dissipation blades 12 is disposed between adjacent two fixing blocks 13.

The heat dissipation structure 10 further includes a first graphene layer 16 and a second graphene layer 17. The first graphene layer 16 is formed on the first sidewall 112, and the second graphene layer 17 is formed on the second sidewall 113. The first graphene layer 16 and the second graphene layer 17 are disposed in the first accommodation space 101. The first connecting holes 14 further penetrate through the first graphene layer 16, and the second connecting holes 15 further penetrate through the second graphene layer 17.

In this disclosure, a heat dissipation structure is added to the position of the shaft of the hinge of the existing foldable display device, and the first connecting holes 14 and the second connecting holes 15 are disposed on sidewalls of the base material of the heat dissipation structure. The first connecting holes 14 and the second connecting holes 15 connect the first accommodation space 101 of the heat dissipation structure 10 to the second accommodation space 102, formed by the flexible screen and the first middle frame and the third accommodation space 103, formed by the flexible screen and the second middle frame 30, so that the connections of the whole device can be implemented in the inner spaces of the foldable display device 100. Thus, the heat of the whole device of the foldable display device 100 can be balanced to make the heat of the whole device be uniformly distributed.

The heat dissipation structure 10 has the heat dissipation blades 12. When the foldable display device 100 is folded or deployed, the heat dissipation blades 12 push the air in an axial direction of the shaft of the hinge to form the local negative pressure. At this time, the air in the second accommodation space 102 and the air in the third accommodation space 103 are respectively pushed, by the atmosphere, into the first accommodation space 101 of the heat dissipation structure through the first connecting holes 14 and the second connecting holes 15 to form flowing air streams, and take the heat away from the second accommodation space 102 and the third accommodation space 103 to achieve the good heat dissipation effect of the whole device.

In the foldable display device 100 provided by this disclosure, the metal material (e.g. copper) is adopted to manufacture the base material layer 11 of the heat dissipation structure 10 and to form the first graphene layer 16 and the second graphene layer 17 on the surfaces of the base material layer 11 facing the hinge. Because the copper has the good thermal conductivity and the high Z-direction thermoconductive efficiency, the heat in the second accommodation space 102 and the third accommodation space 103 can be further rapidly transferred to the first graphene layer 16 and the second graphene layer 17 through the base material layer 11. In addition, because the first graphene layer 16 and the second graphene layer 17 are disposed on the base material layer 11 of the heat dissipation structure 10, the thermal radiation surface area of the graphene is enlarged, and the heat can be radiated out more rapidly.

Referring again to FIG. 1, the first middle frame 20 is provided with multiple second fixing holes 21 and multiple third fixing holes 22. The second fixing holes 21 are for fixing the electronic component, and the third fixing holes 22 are for fixing one side of the hinge rotatable relatively to the shaft thereof. The third fixing holes 22 are close to the heat dissipation structure 10. The second middle frame 30 is provided with multiple fourth fixing holes 31 and multiple fifth fixing holes 32. The fourth fixing holes 31 are for fixing the electronic component, and the fifth fixing holes 32 are for fixing the other side of the hinge rotatable relatively to the shaft thereof. The fifth fixing holes 32 are close to the heat dissipation structure 10.

In the foldable display device 100 provided by this disclosure, the above-mentioned two heat dissipation methods are adopted to achieve the good heat dissipation effect of the whole device to decrease the probability of occurrence of the poor effects of the screen burn-in, non-uniform brightness and the like, thus to protect the electronic components inside the foldable display device, increase the lifetime of the foldable display device, and thereby improve the user experience.

In summary, although this disclosure has been disclosed hereinabove in preferred embodiments, the above-mentioned preferred embodiments do not intend to limit this disclosure. Those of ordinary skill in the art can make various changes and modifications without departing from the spirit and scope of this disclosure. Therefore, the protection scope of this disclosure should be subject to the scope defined by the claims.

In order to make purposes, technical solutions, and effects of the present application clearer and more specific, the present application is further described in detail below with reference to the accompanying drawings and examples. It should be understood that the specific embodiments described herein are only used to explain the present application, and are not used to limit the present application.

It can be understood that those having ordinary skills of the art may easily contemplate various changes and modifications of the technical solution and technical ideas of the present application and all these changes and modifications are considered within the protection scope of right for the present application.

What is claimed is:

1. A heat dissipation structure, comprising:
a base material layer comprising a bottom wall, and a first sidewall and a second sidewall respectively disposed opposite two sides of the bottom wall, wherein the bottom wall, the first sidewall and the second sidewall form a first accommodation space, multiple first connecting holes penetrating through the first sidewall are formed on the first sidewall, and multiple second connecting holes penetrating through the second sidewall are formed on the second sidewall;
wherein the multiple first connecting holes and the multiple second connecting holes are accommodated within the first accommodation space and are configured to enable air to flow into the first accommodation space; and
multiple heat dissipation blades accommodated within the first accommodation space and disposed on the bottom wall.

2. The heat dissipation structure according to claim 1, wherein a material of the base material layer is a metal material.

3. The heat dissipation structure according to claim 2, wherein a material of the base material layer is a copper material.

4. The heat dissipation structure according to claim 1, further comprising a first graphene layer and a second graphene layer, wherein the first graphene layer is formed on the first sidewall, the second graphene layer is formed on the second sidewall, the first graphene layer and the second graphene layer are disposed in the first accommodation space, the multiple first connecting holes further penetrate through the first graphene layer, and the multiple second connecting holes further penetrate through the second graphene layer.

5. The heat dissipation structure according to claim 1, wherein the multiple first connecting holes are separately disposed on one end of the first sidewall away from the bottom wall, the multiple second connecting holes are separately disposed on one end of the second sidewall away from the bottom wall, and positions of the multiple first connecting holes correspond to positions of the multiple second connecting holes in a one-to-one manner.

6. The heat dissipation structure according to claim 5, wherein the multiple first connecting holes are equidistantly and separately disposed on the first sidewall, and the multiple second connecting holes are equidistantly and separately disposed on the second sidewall.

7. The heat dissipation structure according to claim 1, wherein the bottom wall, the first sidewall and the second sidewall are integrally formed together.

8. The heat dissipation structure according to claim 1, wherein the first sidewall and the second sidewall are arced, and centers of arcs of the first sidewall and the second sidewall are disposed in the first accommodation space.

9. The heat dissipation structure according to claim 1, wherein the multiple heat dissipation blades are separately disposed on the bottom wall in a lengthwise direction of the bottom wall, and intersecting lines between the multiple heat dissipation blades and the bottom wall are inclined to a widthwise direction of the bottom wall.

10. The heat dissipation structure according to claim 1, further comprising one or multiple fixing blocks, wherein the one or multiple fixing blocks are separately disposed on the bottom wall in a lengthwise direction of the bottom wall, and each of the one or multiple fixing blocks has a fixing hole for fixing a shaft of a hinge.

11. A foldable display device, comprising a flexible screen, a first middle frame, a second middle frame, a hinge and a heat dissipation structure, wherein: two ends of the hinge are respectively mounted on the first middle frame and the second middle frame and are capable of driving the first middle frame and the second middle frame to be folded or deployed relatively to a shaft of the hinge; the flexible screen is disposed above the hinge, and two ends of the flexible screen are respectively mounted on the first middle frame and the second middle frame; the heat dissipation structure is disposed between the first middle frame and the second middle frame and mounted on the shaft of the hinge; and the heat dissipation structure comprises:

a base material layer comprising a bottom wall, and a first sidewall and a second sidewall respectively disposed opposite two sides of the bottom wall, wherein the bottom wall, the first sidewall and the second sidewall form a first accommodation space, the shaft of the hinge is mounted on the bottom wall, multiple first connecting holes penetrating through the first sidewall are formed on the first sidewall, and multiple second connecting holes penetrating through the second sidewall are formed on the second sidewall;

wherein the flexible screen and the first middle frame form a second accommodation space, and the flexible screen and the second middle frame form a third accommodation space; and wherein the multiple first connecting holes are connected to the second accommodation space, and the multiple second connecting holes are connected to the third accommodation space.

12. The foldable display device according to claim 11, wherein the heat dissipation structure further comprises multiple heat dissipation blades accommodated within the first accommodation space and disposed on the bottom wall.

13. The foldable display device according to claim 12, wherein the multiple heat dissipation blades are separately disposed on the bottom wall in a lengthwise direction of the bottom wall, and intersecting lines between the multiple heat dissipation blades and the bottom wall are inclined to a widthwise direction of the bottom wall.

14. The foldable display device according to claim 11, wherein a material of the base material layer is a metal material.

15. The foldable display device according to claim 14, wherein a material of the base material layer is a copper material.

16. The foldable display device according to claim 11, wherein the heat dissipation structure further comprises a first graphene layer and a second graphene layer, wherein the first graphene layer is formed on the first sidewall, the second graphene layer is formed on the second sidewall, the first graphene layer and the second graphene layer are disposed in the first accommodation space, the multiple first connecting holes further penetrate through the first graphene layer, and the multiple second connecting holes further penetrate through the second graphene layer.

17. The foldable display device according to claim 11, wherein the multiple first connecting holes are separately disposed on one end of the first sidewall away from the bottom wall, the multiple second connecting holes are separately disposed on one end of the second sidewall away from the bottom wall, and positions of the multiple first connecting holes correspond to positions of the multiple second connecting holes in a one-to-one manner.

18. The foldable display device according to claim 11, wherein the heat dissipation structure further comprises one or multiple fixing blocks, wherein the one or multiple fixing blocks are separately disposed on the bottom wall in a lengthwise direction of the bottom wall, and each of the one or multiple fixing blocks has a fixing hole for fixing the shaft of the hinge.

19. The foldable display device according to claim 11, wherein the bottom wall, the first sidewall and the second sidewall are integrally formed together.

20. The foldable display device according to claim 11, wherein the first sidewall and the second sidewall are arced, and centers of arcs of the first sidewall and the second sidewall are disposed in the first accommodation space.

* * * * *